(12) United States Patent
Zheng et al.

(10) Patent No.: US 6,762,085 B2
(45) Date of Patent: Jul. 13, 2004

(54) METHOD OF FORMING A HIGH PERFORMANCE AND LOW COST CMOS DEVICE

(75) Inventors: Jia Zhen Zheng, Singapore (SG); Soh Yun Siah, Singapore (SG); Liang Choo Hsia, Singapore (SG); Eng Hua Lim, Singapore (SG); Simon Chooi, Singapore (SG); Chew Hoe Ang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 2 days.

(21) Appl. No.: 10/262,169

(22) Filed: Oct. 1, 2002

(65) Prior Publication Data

US 2004/0063264 A1 Apr. 1, 2004

(51) Int. Cl.$^7$ .......................................... H01L 21/8238
(52) U.S. Cl. ...................... 438/199; 438/372; 438/373
(58) Field of Search ............................. 438/199, 197, 438/202, 203

(56) References Cited

U.S. PATENT DOCUMENTS

| | | | |
|---|---|---|---|
| 5,290,720 A | * 3/1994 | Chen | 438/304 |
| 6,156,598 A | 12/2000 | Zhou et al. | 438/231 |
| 6,251,764 B1 | 6/2001 | Pradeep et al. | 438/595 |
| 6,277,683 B1 | * 8/2001 | Pradeep et al. | 438/200 |
| 6,319,783 B1 | 11/2001 | Ang et al. | 438/300 |
| 6,346,468 B1 | 2/2002 | Pradeep et al. | 438/595 |
| 6,348,387 B1 | 2/2002 | Yu | 438/303 |

* cited by examiner

Primary Examiner—David Nelms
Assistant Examiner—Thao P. Le
(74) Attorney, Agent, or Firm—George O. Saile; Rosemary L. S. Pike

(57) ABSTRACT

A method of fabricating a CMOS device with reduced processing costs as a result of a reduction in photolithographic masking procedures, has been developed. The method features formation of L shaped silicon oxide spacers on the sides of gate structures, with a vertical spacer component located on the sides of the gate structure, and with horizontal spacer components located on the surface of the semiconductor substrate with a thick horizontal spacer component located adjacent to the gate structures, while a thinner horizontal spacer component is located adjacent to the thicker horizontal spacer component. After formation of a block out shape in a PMOS region of the CMOS device, a high angle implantation procedure is used to form a P type halo region in a top portion of the NMOS region, followed by another implantation procedure performed at lower implant angles, resulting in an N type LDD region in a portion of the NMOS region underlying the thicker horizontal spacer component, and resulting in an N type heavily doped source/drain region in a portion of the NMOS underlying the thinner horizontal spacer component. Another block out shape, and another series of similar implantation procedures is performed to create the halo, LDD and source/drain regions in the PMOS region. After formation of a photoresist block out shape on specific CMOS regions, a composite insulator spacer is formed on the sides of gate structures not covered by the photoresist shape, followed by formation of metal silicide on the gate structures and source/drain regions not covered by the photoresist block out shape.

27 Claims, 5 Drawing Sheets

METHOD OF FORMING A HIGH PERFORMANCE AND LOW COST CMOS DEVICE

BACKGROUND OF THE INVENTION (1) Field of the Invention

The present invention relates to methods used to fabricate semiconductor devices, and more specifically to a method used to form a high performance CMOS device at a lower fabrication cost as a result of reduced masking procedures.

(2) Description of Prior Art

Micro-miniaturization, or the ability to fabricate semiconductor devices comprised with sub-micron features, has allowed device performance to be increased. Complimentary metal oxide semiconductor (CMOS) devices, comprised with both N channel (NMOS), and P channel (PMOS) elements have benefited, in terms of increased performance, as a result of micro-miniaturization. The fabrication costs for CMOS devices however have remained extensive due to the numerous masking procedures needed. This invention will describe a novel fabrication sequence for a CMOS device in which performance increases are realized while the fabrication cost can be reduced when compared to counterpart CMOS devices achieved without the use of this present invention. The decrease in CMOS fabrication cost is achieved via a reduction in photolithographic masking steps. Novel procedures featuring disposable spacers allow several photolithographic masking steps that are used with counterpart CMOS devices fabricated without the use of this invention, to be eliminated. Prior art such as Pradeep et al, in U.S. Pat. No. 6,346,468 B1, Ang et al, in U.S. Pat. No. 6,319,783 B1, Pradeep et al, in U.S. Pat. No. 6,251,764 B1, Zhou et al, in U.S. Pat. No. 6,156,598, and Yu, in U.S. Pat. No. 6,348,387 B1, describe L-shaped spacers as well as lightly doped source/drain regions formed through L shaped spacers. However none of the prior art describe the novel process sequence described in the present invention in which a combination of L shape, and disposable spacers are used to reduce the number of photolithographic masking procedures used to fabricate both the NMOS and PMOS elements of a CMOS device.

SUMMARY OF THE INVENTION

It is an object of this invention to reduce the processing cost of a metal oxide semiconductor field effect (MOSFET) device, via a reduction in the number of photolithographic masking steps used for fabrication of the device.

It is another object of this invention to apply the cost savings realized via reduction of photolithographic masking procedures, to the fabrication of CMOS devices comprised with both NMOS and PMOS elements.

It is still another object of this invention to use a partially removed spacer structure, in combination with ion implantation procedures performed at various implantation angles, to allow several features of the NMOS and PMOS elements to be formed using a minimum of photolithographic masking procedures.

It still yet another object of this invention to allow a process used to restore the partially removed spacer structure to allow a salicide procedure to be selectively performed in specific regions of the CMOS elements.

A method of fabricating a CMOS device, featuring a reduction in processing costs achieved via the reduction in photolithographic masking procedures, is described. After formation of a gate structure on an underlying gate insulator layer in regions of a semiconductor substrate to be used for the NMOS and for the PMOS elements of a CMOS device, a first insulator spacer comprised of an underlying silicon oxide layer and an overlying silicon nitride shape is formed on the sides of the gate structure. Removal of the silicon nitride shape results in a silicon oxide L shaped spacer comprised with a thick silicon oxide portion in a region underlying a previously removed silicon nitride shape, and comprised with a thinner silicon portion on regions exposed to the spacer definition and silicon nitride removal procedures. After formation of a block out mask on a specific CMOS element, a series of implantation procedures are performed to form the halo, lightly doped source/drain (LDD), and heavily doped source/drain regions, for an exposed CMOS element. The halo region is formed using a high angle implantation, while a lower angle implantation procedure results in an LDD region underlying the thick silicon oxide portion, and results in a deeper, heavily doped source/drain region located underlying the thinner silicon oxide portion. The same procedure, block out mask, and series of implantation procedures are then used to form similar features for the previously blocked CMOS element. Formation of silicon nitride shapes on L shaped spacers, featuring silicon nitride extensions overlying halo, LDD and heavily doped source/drain regions in regions of a specific CMOS device, allow other non-protected regions of the another specific CMOS device to experience salicide formation on exposed source/drain and gate regions.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
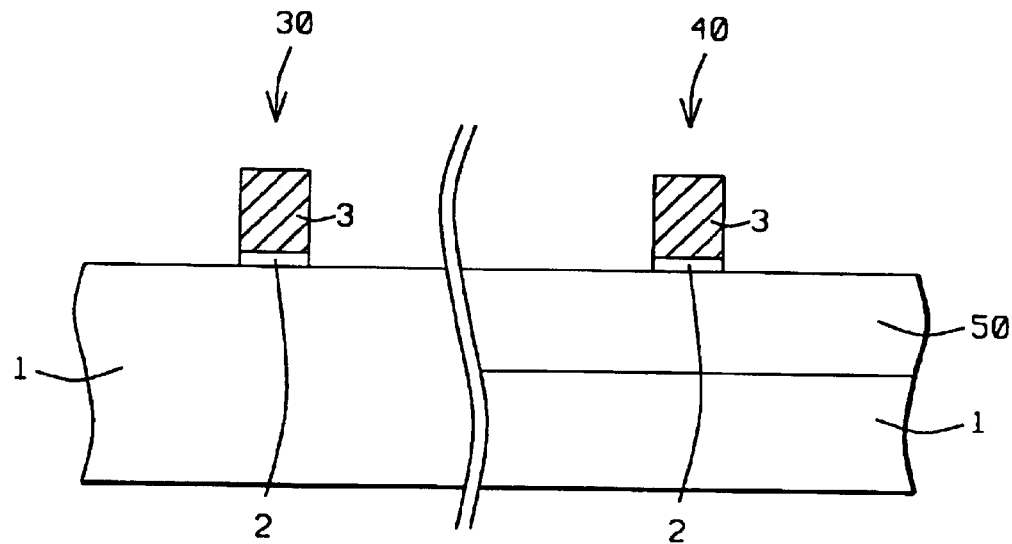
FIGS. 1–10, which schematically, in cross-sectional style, show key stages used to fabricate a CMOS device featuring a reduction in photolithographic masking procedures.

The method of fabricating a CMOS device with reduced process cost as a result of reducing the number of photolithographic masking procedures, and featuring a series of implantation procedures performed at various implantation angles through a partially removed spacer structure, to form halo, LDD, and heavily doped source/drain regions, will now be described in detail. Semiconductor substrate 1, comprised of single crystalline silicon with a <100> crystallographic orientation, is used and schematically shown in FIG. 1. First region 30, of semiconductor substrate 1, will be used to accommodate the NMOS element of a CMOS device, while second region 40, will be used to accommodate the PMOS element. A photoresist shape, not shown in the drawings is used to protect NMOS region 30, from implantation of arsenic or phosphorous ions, used to form N well region 50, in a top portion of semiconductor substrate 1, in PMOS region 40. After a plasma oxygen ashing procedure used to remove the photoresist shape used to protect NMOS region from N well formation, silicon dioxide gate insulator layer 2, is thermally grown to a thickness between about 10 to 100 Angstroms. A conductive layer such as a doped polysilicon layer, or a polycide layer comprised of a metal silicide layer on an underlying polysilicon layer, is next deposited via low pressure chemical vapor deposition (LPCVD) procedures, to a thickness between about 1000 to 3000 Angstroms. A photoresist shape, not shown in the drawings, is then used as an etch mask to allow an anisotropic reactive ion etch (RIE), procedure to define gate structures 3, using $Cl_2$ or $SF_6$ as an etchant for the conductive layer. The width of gate structures 3, is between about 0.05 to 10 um. The photoresist shape used to define gate structures 3, is next removed via a plasma oxygen ashing procedures, followed by a final wet clean cycle. The wet clean cycle features the use of a buffered hydrofluoric (BHF), step resulting in removal of the portions of silicon dioxide gate insulator layer not covered by gate structures 3. The result of these procedures is schematically shown in FIG. 1.

Figure 2:
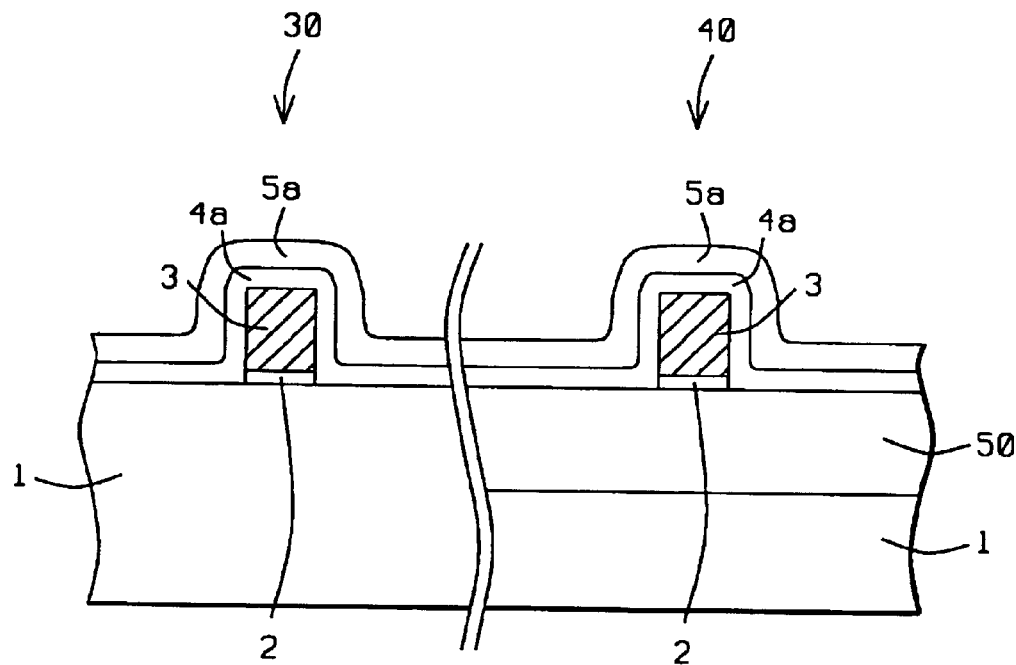
Figure 3:
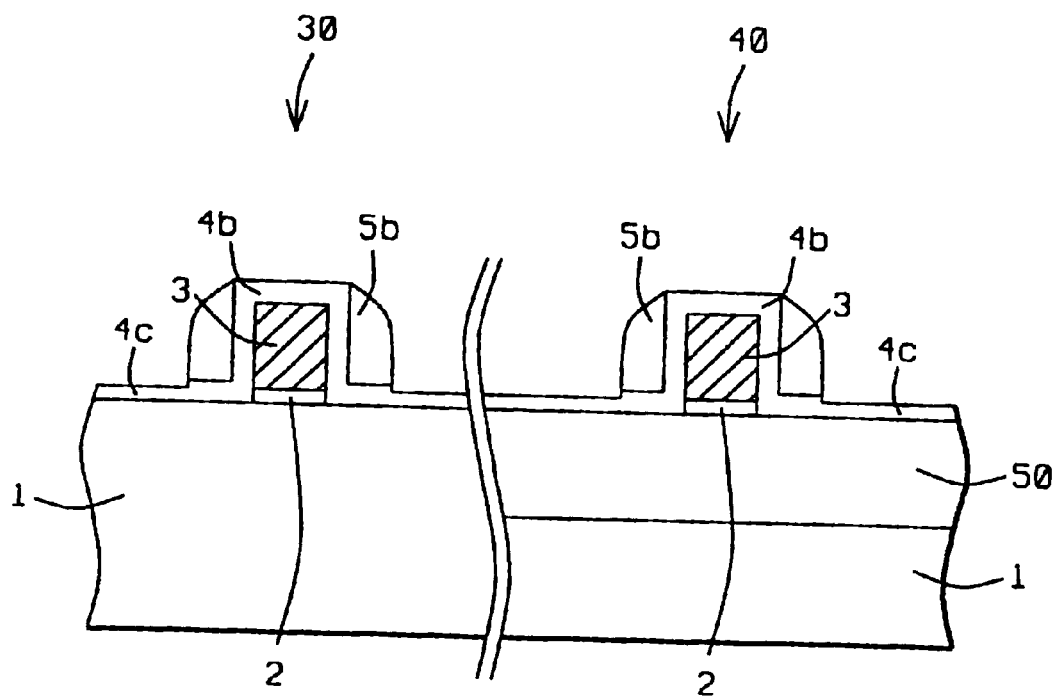

The formation of a first composite insulator spacer on the sides of gate structures 3, is next addressed and schematically described using FIGS. 2–3. Silicon oxide layer 4a, is first deposited at a thickness between about 200 to 400 Angstroms via LPCVD or via plasma enhanced chemical vapor deposition (PECVD) procedures. Silicon nitride layer 5a, shown schematically in FIG. 2, is now deposited via LPCVD or PECVD procedures to a thickness between about 500 to 800 Angstroms. An anisotropic RIE procedure using $Cl_2$ or $CF_4$ as an etchant for silicon nitride, is employed to define silicon nitride shapes 5b, on underlying silicon oxide layer 4a. After definition of silicon nitride shapes 5b, an over etch cycle of the anisotropic RIE procedure is performed removing a top portion of regions of silicon oxide layer 4a, not covered by silicon nitride shapes 5b, resulting in a thinner, silicon oxide component 4c, now at a thickness between about 150 to 250 Angstroms, while the unetched portion of silicon oxide layer 4a, now defined as silicon oxide component 4b, remains underlying silicon nitride shapes 5b, at a thickness between about 200 to 400 Angstroms. If desired thinned, silicon oxide component 4c, can be obtained via subjection to the anisotropic RIE procedure using $CHF_3$ as an etchant for silicon oxide, initiated directly after definition of silicon nitride shapes 5b. The result of this procedure is schematically shown in FIG. 3.

Figure 4:
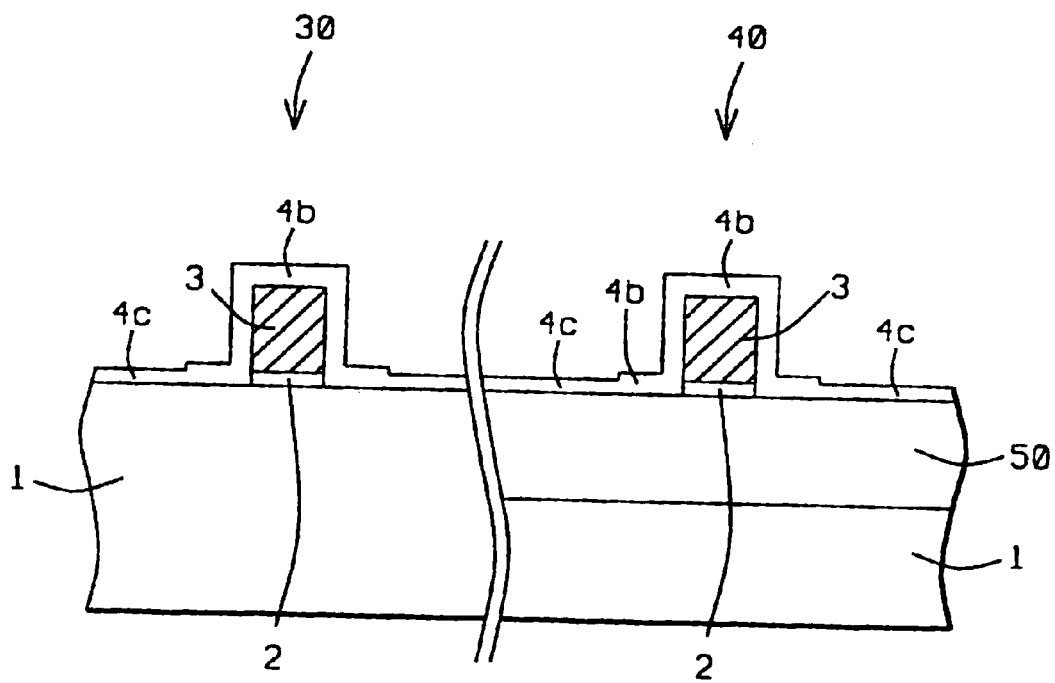

Selective removal of silicon nitride shapes 5b, is next accomplished via use of a hot phosphoric acid solution, resulting in L shaped silicon oxide spacers comprised of thick silicon oxide component 4b, located on the sides of gate structures 3, as well as on adjacent regions of the semiconductor substrate previously covered by the removed silicon nitride shapes 5b. The L shapes silicon oxide spacers are also comprised of thinner, silicon oxide component 4c, regions not previously covered by the removed silicon nitride shapes. The result of this procedure is schematically shown in FIG. 4.

Figure 5:
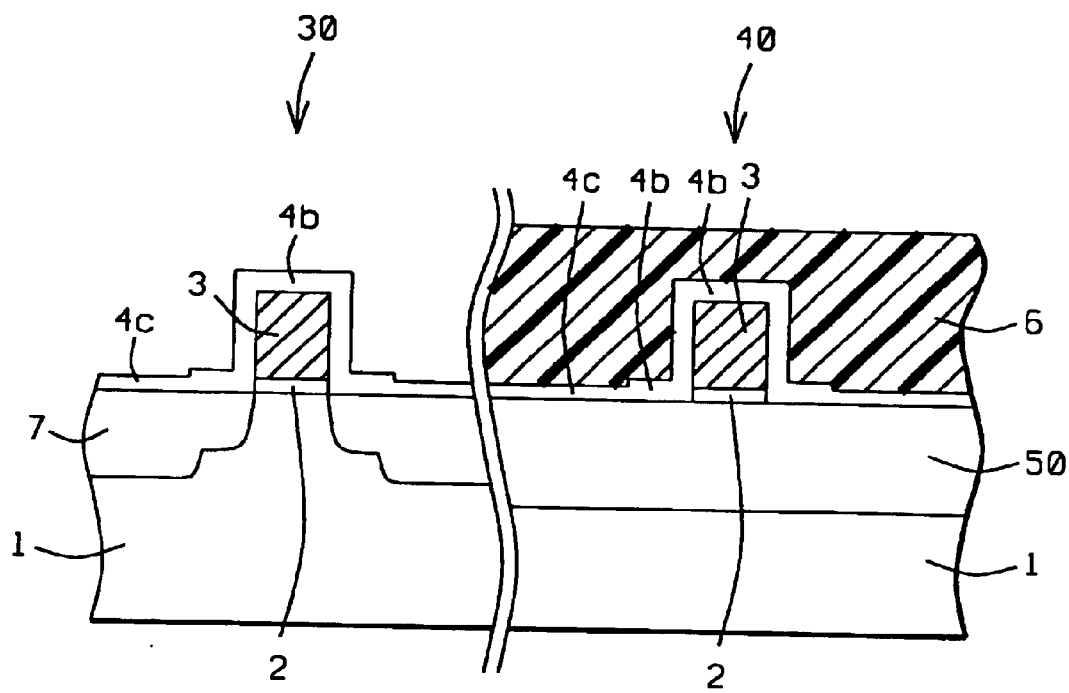

Photoresist shape 6, is next formed on PMOS region 40, and used as a block out mask to allow halo, LDD regions, and heavily doped source/drain regions, to be formed in specific locations in NMOS region 30. A halo region is employed to increase the dopant concentration in an area of the semiconductor substrate that will be used to accommodate a subsequent source/drain region. The higher dopant concentration provided by the halo region reduces the extent of the source/drain depletion region and thus reduces the risk of punch through, or leakage between depletion regions. Therefore the halo region has to be formed in a specific portion of the semiconductor substrate, allowing for containment of an entire source or drain region. Accordingly an implantation procedure is performed using boron or $BF_2$ ions, at an energy between about 10 to 40 KeV, at a dose between about 1E13 to 1E15 atoms/cm², to form halo region 7, with a P type concentration greater than the P type concentration of semiconductor substrate 1, in a region that will accommodate the subsequent source/drain region, a large implant angle, between about 5 to 20° has to be used. The large implant angle allows the P type halo region to extend to a location underlying L shaped silicon oxide spacer 4b, as well as to a location underlying a portion of gate structure 3. This is schematically shown in FIG. 5.

Figure 6:
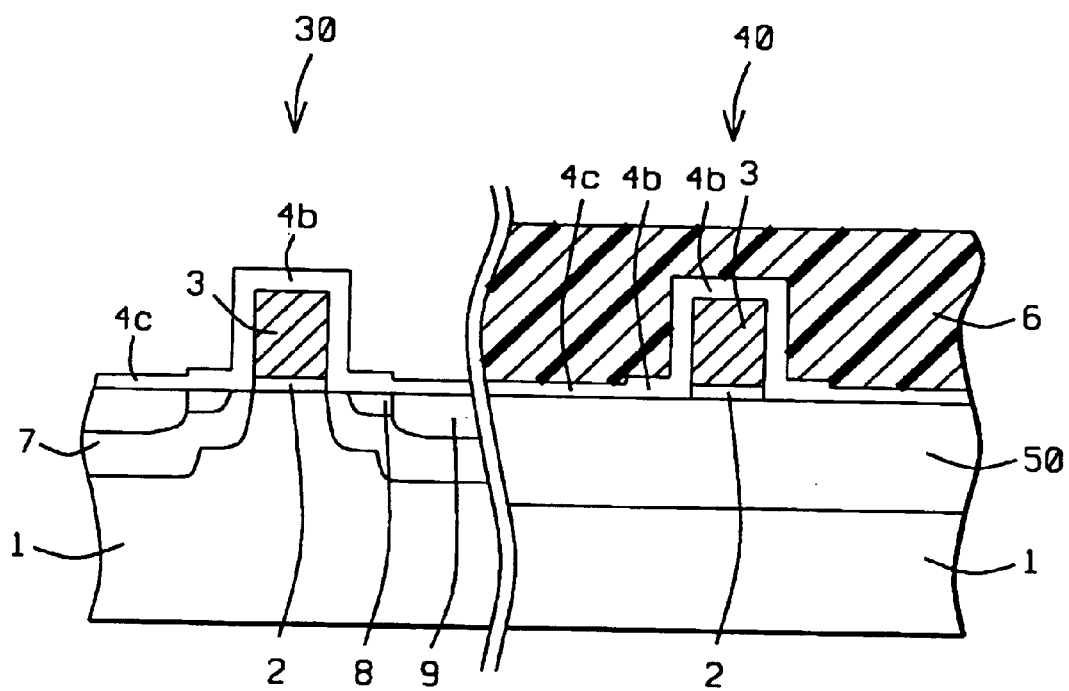

With photoresist shape 6, still in place, N type LDD region 8, and heavily doped N type source/drain region 9, are formed in regions of semiconductor substrate 1, not covered by gate structure 3, or by the vertical component of the L shaped silicon oxide spacer. This is accomplished via implantation of arsenic or phosphorous ions at an energy between about 1 to 10 KeV, at a dose between about 1E14 to 1E16 atoms/cm², and via use of a low implant angle between about 0 to 7°. The implant energy and the difference in thickness between thick silicon oxide component 4b, and thinner silicon oxide component 4c, result in a deeper and more concentrated heavily doped N type source/drain region 9, established underlying thinner silicon oxide component 4c, while a shallower and less concentrated N type LDD region 8, is formed underlying thicker silicon oxide component 4b. This is schematically shown in FIG. 6. Thus a single photolithographic masking procedure was employed for formation of P type halo region 7, N type LDD region 8, and heavily doped N type source/drain region 9.

Figure 7:
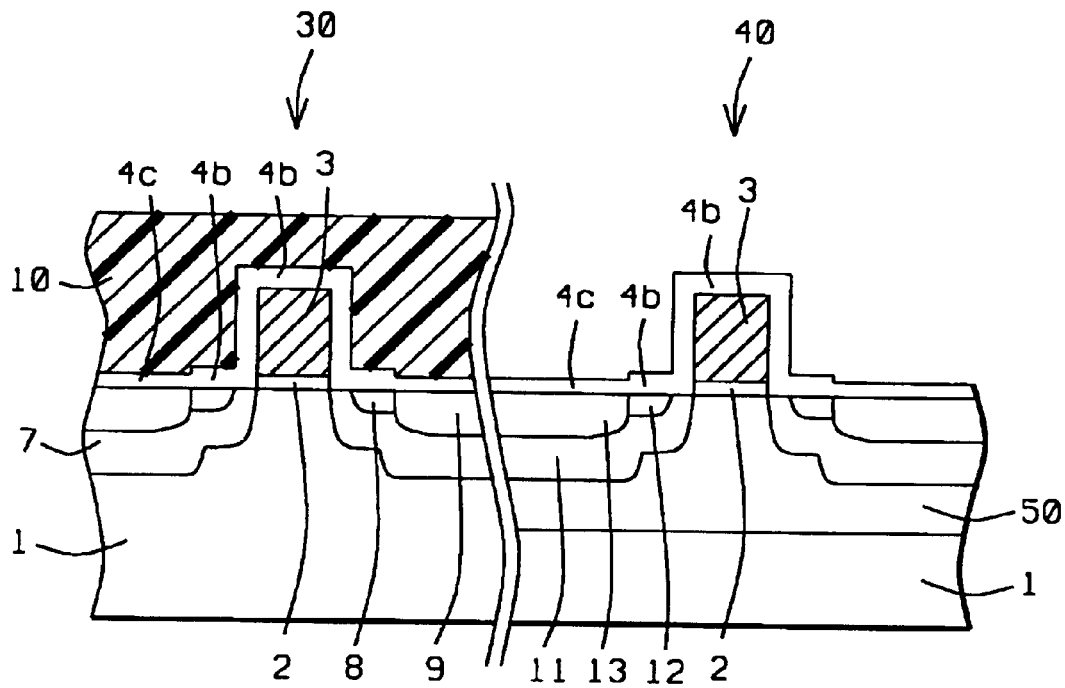

After removal of photoresist shape 6, via plasma oxygen ashing procedures, photoresist shaper 10, is formed on NMOS region 30, to protect this region from ion implantation procedures used to form the halo and source/drain regions for PMOS region 40. Halo region 11, is first formed via implantation of arsenic or phosphorous ions at an energy between about 80 to 150 KeV, at a dose between about 1E13 to 1E14 atoms/cm², and again using a large implant angle between about 10 to 50°, needed to allow the N type halo region to form underlying a portion of the gate structure. The N type dopant concentration of halo region 11, is formed with a higher N type dopant concentration than that of N well region 50, to reduce source/drain punch through or leakage phenomena which can occur if P type source/drain depletion regions encroach. This is schematically illustrated in FIG. 7. With photoresist shape 10, still in place, P type LDD region 12, and heavily doped P type source/drain region 13, are formed in regions of semiconductor substrate 1, not covered by gate structure 3, or by the vertical component of L shaped silicon oxide spacer. This is accomplished via implantation of boron or $BF_2$ ions at an energy between about 0.2 to 1.0 KeV, at a dose between about 1E13 to 1E16 atoms/cm², and via use of a low implant angle between about 0 to 7. Again as was the case for the LDD and heavily doped source/drain regions in NMOS region 30, the implant energy and the difference in thickness between thick silicon oxide component 4b, and thinner silicon oxide component 4c, result in a deeper and more concentrated heavily doped P type source/drain region 13, established underlying thinner silicon oxide component 4c, while a shallower and less concentrated P type LDD region 12, is formed underlying thicker silicon oxide component 4b. This is schematically shown in FIG. 7. Therefore again a single photolithographic a masking procedure was employed to allow a P type halo region, an N type LDD region, and a heavily doped P type source/drain region, to be obtained.

Figure 8:
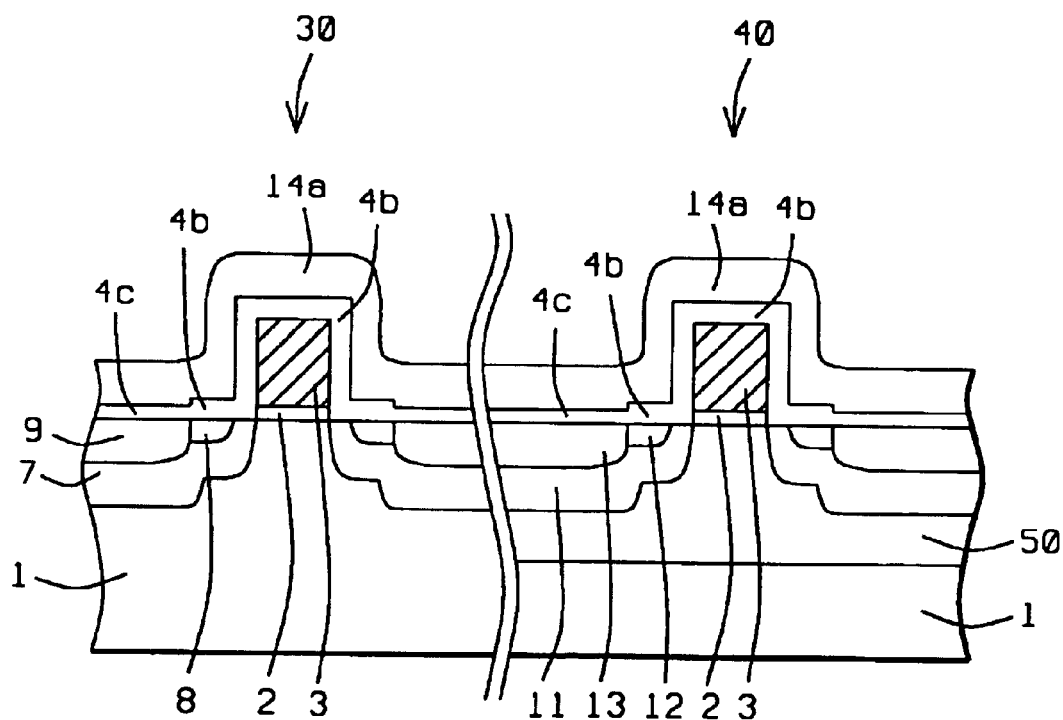
Figure 9:
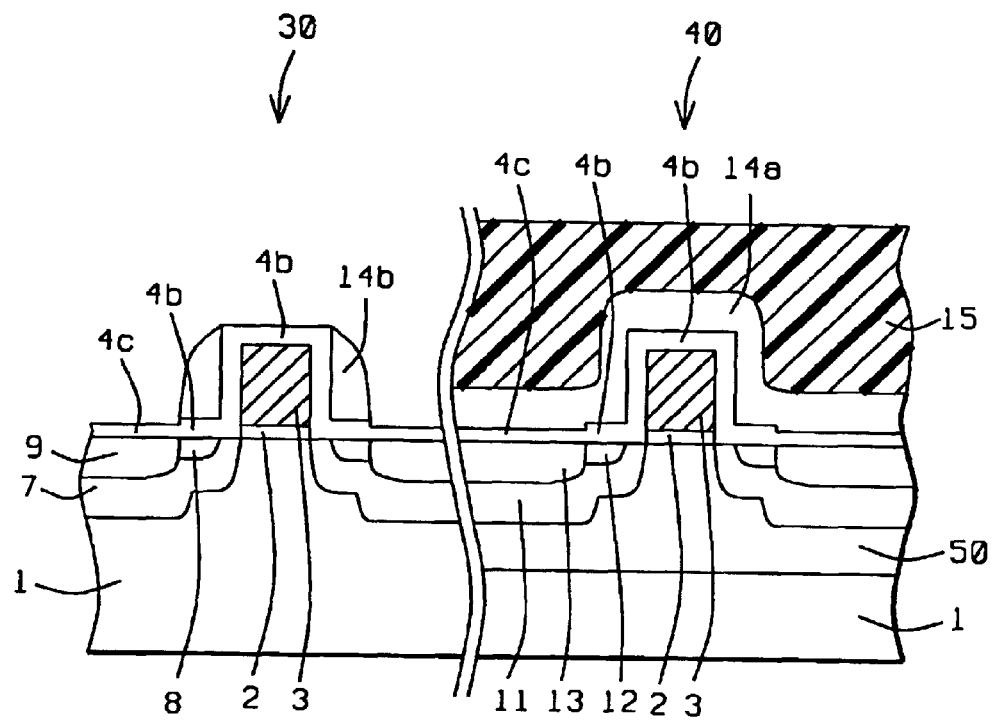

After removal of photoresist shape 10, via plasma oxygen ashing, silicon nitride layer 14a, is deposited via LPCVD or PECVD procedures, to a thickness between about 200 to 800 Angstroms. This is schematically shown in FIG. 8. If a first group of devices require lower source/drain and gate resistance a self aligned silicide (salicide), procedure is employed, while a second group of devices not requiring lower resistance is protected from the salicide procedure. This is accomplished via protection of the second group of devices via use of a photoresist block out shape, while the first group of devices is subjected to a procedure allowing the gate structure and the source/drain regions to experience the salicide procedure. In this description as an example NMOS region 30, will be the first group of devices requiring low gate and source/drain resistance while PMOS region 40, will be the second group of devices not requiring the resistance lowering salicide procedure. However it should be noted that this is only an example for illustration and that the following process sequence can either subject, or protect, devices from either NMOS or PMOS regions to the salicide procedure. Photoresist shape 15, is used as a block out mask allowing an anisotropic RIE procedure, using $Cl_2$ or $CF_4$ as an etchant to define silicon nitride shapes 14b, on the sides of, and overlying thick silicon oxide component 4b, in NMOS region 30. This is schematically shown in FIG. 9.

Figure 10:
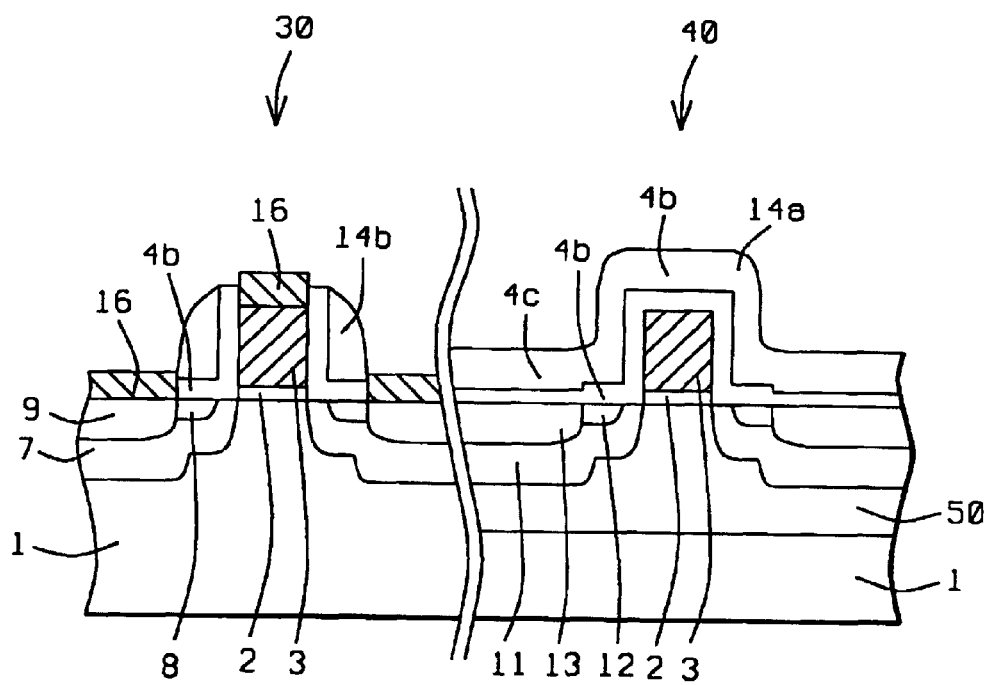

After removal of photoresist shape 15, via plasma oxygen ashing a wet etch procedure, using BHF as an etchant for silicon oxide, is used to expose the top surface of gate structure 3, and of heavily doped N type source/drain region 9, in NMOS region 30. Silicon nitride layer 14a, protected the gate structure and source/drain regions in PMOS region 40, from the BHF, silicon oxide removal procedure. A metal layer, chosen from a group that contains titanium, tantalum, tungsten, nickel cobalt, and zirconium, is next deposited via chemical vapor deposition (CVD), or via plasma vapor deposition (PVD), procedures, to a thickness between about 100 to 300 Angstroms. An anneal procedure is next performed either in a conventional furnace or via rapid thermal anneal (RTA) procedures, at a temperature between about 400 to 600° C., for a time between about 1 to 10 min, in an inert ambient, resulting in metal silicide formation on the exposed surfaces of gate structure 3, and heavily doped N type source/drain region 9, while unreacted metal remains on silicon nitride shapes 14b, and on silicon nitride layer 14a, in PMOS region 40. Removal of unreacted metal is selectively accomplished using a solution comprised of $HCl$—$H_2O_2$—$NH_4OH$—$H_2O$, resulting in metal silicide layers 16, comprised of either titanium silicide, tantalum silicide, tungsten silicide, nickel silicide, cobalt silicide, and zirconium silicide, located on gate structure 3, and on heavily doped N type source/drain region 9. The salicide blocking procedure and the formation of a composite spacer comprised of silicon nitride shapes 14b, on thick silicon oxide component 4b, in NMOS region 30, and of a composite spacer comprised of silicon nitride layer 14a, on thick silicon oxide component 4b, in PMOS region 40, was accomplished using only a single photolithographic masking procedure. The result of the salicide procedure is schematically shown in FIG. 10.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a complimentary metal oxide semiconductor (CMOS) device on a semiconductor substrate, comprising the steps of:

providing a first device region of said semiconductor substrate to accommodate a first conductivity type device, and providing a second device region of said semiconductor substrate to accommodate a second conductivity type device;

forming gate structures on an underlying gate insulator layer in said first device region, and in said second device region;

forming insulator structures comprised of a thick insulator component located on the sides of said gate structures and on a first portion of the semiconductor substrate located adjacent to said gate structure, and comprised of a thin insulator component located on a second portion of said semiconductor substrate in turn located adjacent to the thick insulator component overlying said first portion of said semiconductor substrate;

performing a first series of ion implantation procedures in said first device region wherein a first implantation step of said first series of ion implantation procedures is performed using a first implantation angle, used to form a first halo region of a first conductivity type in said first portion of said semiconductor substrate, in said second portion of said semiconductor substrate, and in a portion of said semiconductor substrate underlying an edge of said gate structure, and wherein a second implantation step of said first series of ion implantation procedures is performed using a second implantation angle, used to form both a first lightly doped source/drain (LDD) region of a second conductivity type in a top portion of said halo region underlying said thick insulator component, and to form a first heavily doped source/drain region of a second conductivity type in a top portion of said halo region located underlying said thin insulator component located overlying said second portion of said semiconductor substrate;

performing a second series of ion implantation procedures in said second device region wherein a first implantation step of said second series of ion implantation procedures is performed using a first implantation angle used to form a second halo region of a second conductivity type in a first portion of said semiconductor substrate, in a second portion of said semiconductor substrate, and in a portion of said semiconductor substrate underlying an edge of said gate structure, and wherein a second implantation step of said second series of ion implantation procedures is performed using a second implantation angle, used to form both a second lightly doped source/drain (LDD) region of a first conductivity type in a top portion of said halo region underlying said thick insulator component, and to form a second heavily doped source/drain region of a first conductivity type in a top portion of said halo region underlying said thin insulator component located overlying said second portion of said semiconductor substrate;

forming insulator shapes on said insulator structure located in said first device region resulting in a composite insulator spacer on gate structure exposing top surface of said gate structure and exposing top surface of said second heavily doped source/drain region; and forming metal silicide on exposed said top surface of said gate structure and on top surface of said first heavily doped source/drain region.

2. The method of claim 1, wherein said first device region is an N channel metal oxide semiconductor (NMOS), device.

3. The method of claim 1, wherein said first device region is a P channel metal oxide semiconductor (PMOS), device.

4. The method of claim 1, wherein said second device region is an N channel metal oxide semiconductor (NMOS), device.

5. The method of claim 1, wherein said second device region is a P channel metal oxide semiconductor (PMOS), device.

6. The method of claim 1, wherein said gate insulator layer is a silicon dioxide layer obtained via thermal oxidation procedures at a thickness between about 10 to 100 Angstroms.

7. The method of claim 1, wherein said gate structures, at a thickness between about 1000 to 3000 Angstroms, are comprised of doped polysilicon, or polycide wherein the polycide is comprised of metal silicide on polysilicon.

8. The method of claim 1, wherein said insulator structure is comprised of silicon oxide, featuring a thick insulator component at a thickness between about 200 to 400 Angstroms, and featuring a thin insulator component at a thickness between about 150 to 350 Angstroms.

9. The method of claim 1, wherein said first halo region is a P type halo region, obtained via said first implantation step of said first series of ion implantation procedures, using boron or $BF_2$ ions, at an energy between about 10 to 40 KeV, at a dose between about 1E13 to 1E15 atoms/$cm^2$, and at said first implantation angle between about 5 to 20 degrees.

10. The method of claim 1, wherein said first LDD region and said first heavily doped source/drain region, are N type regions, both obtained via said second implantation step of said first series of ion implantation procedures using arsenic or phosphorous ions, at an energy between about 1 to 10 KeV, at a dose between about 1E14 to 1E16 atoms/$cm^2$, and using an said second implantation angle between about 0 to 7 degrees.

11. The method of claim 1, wherein said second halo region is an N type halo region, obtained via said first implantation step of second series of ion implantation procedures using arsenic or phosphorous ions, at an energy between about 80 to 150 KeV, at a dose between about 1E13 to 1E14 atoms/$cm^2$, and at an said first implantation angle between about 10 to 50 degrees.

12. The method of claim 1, wherein said second LDD region and said second heavily doped source/drain region, are P type regions, both obtained via said second implantation step of said second series of ion implantation procedures, using boron or $BF_2$ ions at an energy between about 0.2 to 1.0 KeV, at a dose between about 1E13 to 1E16 atoms/$cm^2$, and using said second implantation angle between about 0 to 7 degrees.

13. The method of claim 1, wherein said insulator shapes are comprised of silicon nitride, at a thickness between about 200 to 800 Angstroms.

14. The method of claim 1, wherein said metal silicide is chosen from a group the contains titanium silicide, tantalum silicide, tungsten silicide, nickel silicide, cobalt silicide, and zirconium silicide.

15. A method of fabricating a CMOS device on a semiconductor substrate, comprising the steps of:
providing a first portion of said semiconductor substrate as an N channel metal oxide semiconductor (NMOS) region, to accommodate an NMOS device, and providing a second portion of said semiconductor substrate as a P channel metal oxide semiconductor (PMOS) region to accommodate a PMOS device;
growing a silicon dioxide gate insulator on said semiconductor substrate;
forming gate structures on said silicon dioxide gate insulator layer;
depositing a silicon oxide layer;
depositing a first silicon nitride layer;
performing a first anisotropic reactive ion etch (RIE), procedure to form first composite insulator spacers on the sides of said gate structures, comprised of first silicon nitride shapes on underlying thick silicon oxide shapes, overlying first portions of said semiconductor substrate, and with thin silicon oxide shapes, not covered by said gate structures or by said first composite insulator spacers, formed overlying second portions of said semiconductor substrate;
removing said first silicon nitride shapes resulting in an L shaped silicon oxide spacer comprised of said thick silicon oxide shape on sides of said gate structure and overlying said first portions of said semiconductor substrate, and with said L shaped silicon oxide spacer comprised of said thin silicon oxide shapes overlying said second portions of said semiconductor substrate;
forming a first block out shape in said PMOS region;
performing a first series of ion implantation procedures in said NMOS region wherein a first implantation step of said first series of ion implantation procedures is performed at a first implantation angle of between about 5 to 20 degrees to form a P type halo region in said first portion of said semiconductor substrate, in said second portion of said semiconductor substrate, and in a third portion of said semiconductor substrate located underlying an edge of said gate structure, and wherein a second implantation step of said first series of ion implantation procedures is performed at a second implantation angle of between about 0 to 7 decrees to form both an N type lightly doped source/drain (LDD) region in a top portion of said P type halo region underlying said thick silicon oxide shape, and to form an N type heavily doped source/drain region in a top portion of said P type halo region located underlying said thin silicon oxide shape;
forming a second block out shape in said NMOS region;
performing a second series of ion implantation procedures in said PMOS region wherein a first implantation step of said second series of ion implantation procedures is performed at a first implantation angle between about 5 to 20 degrees to form an N type halo region in a first portion of said semiconductor substrate, in a second portion of said semiconductor substrate, and in a third portion of said semiconductor substrate underlying an edge of said gate structure, and wherein a second implantation step of said second series of ion implantation procedures is performed at a second implantation angle of between about 0 to 7 degrees to form both a P type LDD region in a top portion of said N type halo region underlying said thick silicon oxide shape, and to form a P type heavily doped source/drain region in a top portion of said N type halo region located underlying said thin silicon oxide shape;
depositing a second silicon nitride layer;
performing a second anisotropic RIE procedure resulting in a second composite insulator spacer in said NMOS region, comprised of said second silicon nitride shapes on said thick silicon oxide shapes of said L shaped silicon oxide spacer, and exposing top surface of said N type heavily doped source/drain region, while second silicon nitride layer in said PMOS region remains unetched; and
forming metal silicide on said top surface of said gate structure and on top surface of said N type heavily doped source/drain region, in said NMOS region.

16. The method of claim 15, wherein said silicon dioxide gate insulator layer is obtained via thermal oxidation procedures at a thickness between about 10 to 100 Angstroms.

17. The method of claim 15, wherein said gate structures are defined with a thickness between about 1000 to 3000 Angstroms, comprised of doped polysilicon, or polycide, wherein the polycide is comprised of metal silicide on polysilicon.

18. The method of claim 15, wherein said silicon oxide layer is obtained at a thickness between about 200 to 400 Angstroms via LPCVD or PECVD procedures.

19. The method of claim 15, wherein said first silicon nitride layer is obtained at a thickness between about 500 to 800 Angstroms via LPCVD or PECVD procedures.

20. The method of claim 15, wherein the thickness of said thin silicon oxide shapes of said L shaped silicon oxide spacer are between about 150 to 350 Angstroms, while the thickness of the unetched thick silicon oxide shapes are between about 200 to 400 Angstroms.

21. The method of claim 15, wherein said first block out shape, and said second block out shape, are photoresist shapes.

22. The method of claim 15, wherein said P type halo region is obtained via said first implantation step of said first series of ion implantation procedures, performed using boron or $BF_2$ ions, at an energy between about 10 to 40 KeV, at a dose between about 1E13 to 1E15 atoms/cm$^2$.

23. The method of claim 15, wherein said N type LDD region, and said N type heavily doped source/drain region, are both obtained via said second implantation step of said first series of ion implantation procedures, performed using arsenic or phosphorous ions, at an energy between about 1 to 10 KeV, at a dose between about 1E14 to 1E16 atoms/cm$^2$.

24. The method of claim 15, wherein said N type halo region is obtained via said first implantation step of said second series of ion implantation procedure, performed using arsenic or phosphorous ions, at an energy between about 80 to 150 KeV, at a dose between about 1E13 to 1E14 atoms/cm$^2$.

25. The method of claim 15, wherein said P type LDD region, and said P type heavily doped source/drain region, are both obtained via said second implantation step of said second series of ion implantation procedures, performed using boron or $BF_2$ ions, at an energy between about 0.2 to 1.0 KeV, at a dose between about 1E13 to 1E16 atoms/cm$^2$.

26. The method of claim 15, wherein said second silicon nitride layer is obtained via LPCVD or PECVD procedures, at a thickness between about 200 to 800 Angstroms.

27. The method of claim 15, wherein said metal silicide is chosen from a group that contains titanium silicide, tantalum silicide, tungsten silicide, nickel silicide, cobalt silicide, and zirconium.

* * * * *